(12) United States Patent
Mori et al.

(10) Patent No.: US 7,155,685 B2
(45) Date of Patent: Dec. 26, 2006

(54) OPTIMIZING DESIGNING APPARATUS OF INTEGRATED CIRCUIT, OPTIMIZING DESIGNING METHOD OF INTEGRATED CIRCUIT, AND STORING MEDIUM IN WHICH PROGRAM FOR CARRYING OUT OPTIMIZING DESIGNING METHOD OF INTEGRATED CIRCUIT IS STORED

(75) Inventors: Kenji Mori, Kanagawa (JP); Takashi Nakajima, Chiba (JP)

(73) Assignees: Sipec Corporation, Tokyo (JP); Seiko Instruments Inc., Chiba (JP)

( * ) Notice: Subject to any disclaimer, the term of this patent is extended or adjusted under 35 U.S.C. 154(b) by 342 days.

(21) Appl. No.: 10/745,648

(22) Filed: Dec. 29, 2003

(65) Prior Publication Data

US 2004/0139405 A1   Jul. 15, 2004

(30) Foreign Application Priority Data

Dec. 27, 2002  (JP)  ............................. 2002-381336

(51) Int. Cl.
  *G06F 17/50*  (2006.01)
(52) U.S. Cl. .................... 716/2; 716/4; 703/13; 703/14
(58) Field of Classification Search ................ 716/1–2, 716/4; 703/13–14
  See application file for complete search history.

(56) References Cited

U.S. PATENT DOCUMENTS 6,314,390 B1 *  11/2001  Bittner et al. ................ 703/14

OTHER PUBLICATIONS

Silvac International, Simulation Standard, A Journal for Circuit Simulation and SPICE Modleing Engineers, UCSD HBT SmartSpice Model Released, Silvac International, vol. 8, No. 3, Mar. 1997, pp. 1-12.*

Avant, Star-Hspice Quick Reference Guide, Release 2001.2, Jun. 2001, pp. 1-3, 113-157, 209-232.*

* cited by examiner

*Primary Examiner*—Stacy A Whitmore
(74) *Attorney, Agent, or Firm*—Armstrong, Kratz, Quintos, Hanson & Brooks, LLP

(57) ABSTRACT

It is an object of the present invention to provide a method, an apparatus and a program having high optimization precision and capable of obtaining an answer required by a designer in a short time by combining optimization between individual transistors and optimization as the entire circuit, or by appropriately combining judgment of an operation region, an analysis of the operation region and a SWEEP sensitivity analysis when the optimization is carried out. An optimizing designing apparatus of an integrated circuit for designing a circuit, comprises operation region judging means for adjusting an operation region (linear region, saturation region) of the circuit, operation region analysis means for displaying liner characteristics (Ids-Vgs characteristics) of the circuit and saturation characteristics (Ids-Vds characteristics) of the circuit, and SWEEP sensitivity analysis means for displaying variation in output characteristics of the circuit.

4 Claims, 12 Drawing Sheets

Fig. 11

| line A | line B |
|---|---|
| DC power supply voltage | VDDL VDDL 0 DC 3.0V |
|  | VCEL VDDL CEL dc 0 |
| DC analysis condition | .DC VCEL 0V 3V 0.01V |
| DC output variable | .PRINT DC V(VREFL) V(VPBIASL) V(VPCASL) |
| TRAN power supply voltage | VDDL VDDL 0 DC 3.0V |
|  | VCEL VDDL CEL PULSE(0V 3V 1U 1U 29U 60U) |
| TRAN analysis condition | .TRAN 1U 120U |
| TRAN output variable | .PRINT TRAN V(VREFL) V(VPBIASL) V(VPCASL) |
| AC power supply voltage | VAC1 VDDL VDDLY AC 1 |
|  | VDDL VDDLY 0 DC 3.0V |
|  | VCEL VDDL CEL dc 0 |
| AC analysis condition | .AC DEC 20 0.1 10MEG |
| AC output variable | .PRINT AC VDB(VREFL) VDB(VPBIASL) VDB(VPCASL) |
| temperature analysis condition | .TEMP 50 25 100 |

Fig. 12

| line A | line B |
|---|---|
| name of spec | AC1 |
| execution order | 1 |
| analysis condition | .AC DEC 20 0.1 10MEG |
| difference (%) | 5 |
| output variable | VDB(VREFL) VDB(VPBIASL) VDB(VPCASL) |
| temperature condition | .TEMP 25 |

| line A | line B | line C | line D | line E | line F | line G |
|---|---|---|---|---|---|---|
| input | output | target | minimum value | weight | result | comment |
| VAC1 VDDL VDDLY AC 1 | | | | | | |
| VDDL VDDLY 0 DC 3.0V | | | | | | |
| VCEL VDDL CEL dc 0 | | | | | | |

OPTIMIZING DESIGNING APPARATUS OF INTEGRATED CIRCUIT, OPTIMIZING DESIGNING METHOD OF INTEGRATED CIRCUIT, AND STORING MEDIUM IN WHICH PROGRAM FOR CARRYING OUT OPTIMIZING DESIGNING METHOD OF INTEGRATED CIRCUIT IS STORED

TECHNICAL FIELD

The present invention relates to an optimizing designing apparatus of an integrated circuit and an optimizing designing method of the integrated circuit which designs a second circuit having the same function and performance as those of a first circuit when a producing process or a physical specification of semiconductor is changed. The invention also relates to a storing medium in which a program for carrying out the optimizing designing method of the integrated circuit is stored.

BACKGROUND TECHNIQUE

In a patent document 1 as a conventional technique, an operation of a circuit is simulated, and a parameter of the circuit (gate width and gate length) is optimized based on information of difference between the simulated value and a target value, thereby optimizing the operation of the circuit.

In patent documents 2 and 3, a parameter (gate width and gate length) of a circuit is optimized based on operation point characteristics of a MOS transistor of a semiconductor circuit, thereby optimizing the operation of the circuit.

In patent documents 4 and 5, a parameter (gate width and gate length) is converted based on an equivalent conversion rule 1.

[Patent Document 1]
Japanese Patent Application Laid-open No. H08-123850
[Patent Document 2]
Japanese Patent Application Laid-open No. H10-112506
[Patent Document 3]
Japanese Patent Application Laid-open No. H11-85822
[Patent Document 4]
Japanese Patent Application Laid-open No.2000-29927
[Patent Document 5]
Japanese Patent No.3315391

In the conventional techniques, a circuit parameter (gate width and gate length) is optimized using means such as a difference, a transistor region or an equivalent conversion rule. Any of them can optimize the circuit parameter (gate width and gate length) of a single transistor in the circuit, but there is a problem that the circuit characteristics can not be optimized only by optimizing the single transistor.

On the other hand, it is possible to optimize the entire circuit by improving an optimizing algorithm, but if the circuit parameter (gate width and gate length) of the single transistor is not optimized, there is a problem that it takes time to optimize the circuit or a result that a designer requires can not be obtained. Especially when a process is change, it takes time to convert all the parameters in to variables in a circuit diagram. Therefore, there are problems that a portion which must be adjusted is generated other than a portion which was converted into a variable due to difference of transistor characteristics, that topology of the original integrated circuit can not be changed, that although simulation for optimization requires great time and this is not practical, a good result can not be obtained, that a result of an appropriate circuit parameter can not be obtained, that since a halfway result must be left when the procedure was suspended halfway while the optimization was being carried out, the optimization must be carried out from the beginning when the optimization is again carried out, that kinds of target performance in the optimization are limited, that there are too many parameters to be set and the operability is poor, that since the optimization is totally carried out automatically, a designer can not be involved in the operation during the optimization, that since the procedure and steps of the optimization are determined for every circuit model, there are many unnecessary optimization procedures, and that the procedure and steps of the optimization can not be saved for every circuit.

It is an object of the present invention to provide a method, an apparatus and a program having high optimization precision and capable of obtaining an answer required by a designer in a short time by combining optimization between individual transistors and optimization as the entire circuit, or by appropriately combining judgment of an operation region, an analysis of the operation region and a SWEEP sensitivity analysis when the optimization is carried out.

DISCLOSURE OF THE INVENTION

A first aspect of the present invention provides an optimizing designing apparatus of an integrated circuit for designing a circuit, comprising: operation region judging means which carries out analysis of operation of the circuit, which takes out node voltage of the circuit and transistor current Ids of the circuit obtained as a result of the analysis, which converts the taken out node voltage into voltages Vds and Vgs between nodes of a transistor using circuit topology information, and which judges an operation region (linear region, saturation region) using threshold voltage, the transistor current Ids and the voltages Vds and Vgs between the nodes of the transistor; operation region analysis means which carries out DC analysis or TRAN analysis of the circuit, which takes out node voltage of the circuit and the transistor current Ids of the circuit obtained as a result of the analysis, which converts the taken out node voltage into the voltages Vds and Vgs between the nodes of the transistor using the circuit topology information, and which displays linear characteristics (Ids-Vgs characteristics) and saturation characteristics (Ids-Vds characteristics) using the transistor current Ids and the voltages Vds and Vgs between the nodes of the transistor; and SWEEP sensitivity analysis means which displays variation in output characteristics of the circuit when the circuit parameter (gate width W, gate length L) is varied by $\pm\alpha(\%)$.

A second aspect of the invention provides an optimizing designing apparatus of an integrated circuit for designing a second circuit having the same function as that of a first circuit when producing process, physical specification of a semiconductor or the like is changed, comprising: operation region judging means which carries out analysis of operation of the circuit, which takes out node voltage of the circuit and transistor current Ids of the circuit obtained as a result of the analysis, which converts the taken out node voltage into voltages Vds and Vgs between nodes of a transistor using circuit topology information, and which judges an operation region (linear region, saturation region) using threshold voltage, the transistor current Ids and the voltages Vds and Vgs between the nodes of the transistor; operation region analysis means which carries out DC analysis or TRAN analysis of the circuit, which takes out node voltage of the circuit and the transistor current Ids of the circuit obtained as a result of the analysis, which converts the taken out node voltage into the voltages Vds and Vgs between the nodes of the transistor using the circuit topology information, and which displays linear characteristics (Ids-Vgs characteristics) and saturation characteristics (Ids-Vds characteristics) using the transistor current Ids and the voltages Vds and Vgs between the nodes of the transistor; and LOCAL optimizing means for carrying out the optimization of each transistor of the second circuit corresponding to a transistor constituting the first circuit using a circuit simulator.

A third aspect of the invention provides an optimizing designing apparatus of an integrated circuit for designing a second circuit having the same function as that of a first circuit when producing process, physical specification of a semiconductor or the like is changed, comprising: operation region judging means which carries out analysis of operation of the circuit, which takes out node voltage of the circuit and transistor current Ids of the circuit obtained as a result of the analysis, which converts the taken out node voltage into voltages Vds and Vgs between nodes of a transistor using circuit topology information, and which judges an operation region (linear region, saturation region) using threshold voltage, the transistor current Ids and the voltages Vds and Vgs between the nodes of the transistor; SWEEP sensitivity analysis means which displays variation in output characteristics of the circuit when the circuit parameter (gate width W, gate length L) is varied by $\pm\alpha(\%)$; and GLOBAL optimizing means which designates an arbitrary transistor constituting the second circuit, and which optimizes the second circuit by optimizing the designated transistor using a circuit simulator.

A fourth aspect of the invention provides an optimizing designing apparatus of an integrated circuit for designing a second circuit having the same function as that of a first circuit when producing process, physical specification of a semiconductor or the like is changed, comprising: operation region judging means which carries out analysis of operation of the circuit, which takes out node voltage of the circuit and transistor current Ids of the circuit obtained as a result of the analysis, which converts the taken out node voltage into voltages Vds and Vgs between nodes of a transistor using circuit topology information, and which judges an operation region (linear region, saturation region) using threshold voltage, the transistor current Ids and the voltages Vds and Vgs between the nodes of the transistor; operation region analysis means which carries out DC analysis or TRAN analysis of the circuit, which takes out node voltage of the circuit and the transistor current Ids of the circuit obtained as a result of the analysis, which converts the taken out node voltage into the voltages Vds and Vgs between the nodes of the transistor using the circuit topology information, and which displays linear characteristics (Ids-Vgs characteristics) and saturation characteristics (Ids-Vds characteristics) using the transistor current Ids and the voltages Vds and Vgs between the nodes of the transistor; LOCAL optimizing means for carrying out the optimization of each transistor of the second circuit corresponding to a transistor constituting the first circuit using a circuit simulator; SWEEP sensitivity analysis means which displays variation in output characteristics of the circuit when the circuit parameter (gate width W, gate length L) is varied by $\pm\alpha(\%)$; and GLOBAL optimizing means which designates an arbitrary transistor constituting the second circuit, and which optimizes the second circuit by optimizing the designated transistor using a circuit simulator.

A fifth aspect of the invention provides an optimizing designing method of an integrated circuit for designing a second circuit having the same function as that of a first circuit when producing process, physical specification of a semiconductor or the like is changed, comprising: a LOCAL optimization step for carrying out the optimization of each transistor of the second circuit corresponding to a transistor constituting the first circuit using a circuit simulator; and a GLOBAL optimization step in which if the second circuit is outside a target spec as a result of the LOCAL optimization step, an arbitrary transistor constituting the second circuit is designated, and the second circuit is optimized by optimizing the designated transistor using a circuit simulator.

According to a sixth aspect of the invention, in the optimizing designing method of the integrated circuit of the fifth aspect, in the LOCAL optimization step, a circuit parameter (gate width W, gate length L) of each transistor of the second circuit is optimized using any of the following four conditions, i.e., 1) w value is variable and L value is fixed, 2) W value is fixed and L value is variable, 3) W/L ratio is fixed and W value is variable, and 4) W/L ratio is fixed and L value is variable.

According to a seventh aspect of the invention, in the optimizing designing method of the integrated circuit of the fifth aspect, in the GLOBAL optimization step, a circuit parameter (gate width W, gate length L) of an arbitrary transistor of a group of transistors of the second circuit is optimized such that the second circuit comes into optimization target value range using any of the following four conditions, i.e., 1) w value is variable and L value is fixed, 2) W value is fixed and L value is variable, 3) W/L ratio is fixed and W value is variable, and 4) W/L ratio is fixed and L value is variable.

According to an eighth aspect of the invention, in the optimizing designing method of the integrated circuit of the fifth aspect, the method further comprises a SWEEP sensitivity analysis step for displaying variation in output characteristics of the circuit when the circuit parameter (gate width W, gate length L) of a transistor used in the first circuit and a transistor of the second circuit corresponding to the former transistor of the first circuit is varied by $\pm\alpha(\%)$, and the SWEEP sensitivity analysis step is carried out before the GLOBAL optimization step.

According to a ninth aspect of the invention, in the optimizing designing method of the integrated circuit of the fifth aspect, the method further comprises an operation region analysis step in which for a transistor used in the first circuit and a transistor of the second circuit corresponding to the former transistor of the first circuit, DC analysis or TRAN analysis of the circuit is carried out, node voltage of the circuit and the transistor current Ids of the circuit obtained as a result of the analysis are taken out, the taken out node voltage is converted into the voltages Vds and Vgs between the nodes of the transistor using the circuit topology information, and linear characteristics (Ids-Vgs characteristics) and saturation characteristics (Ids-Vds characteristics) are displayed using the transistor current Ids and the voltages Vds and Vgs between the nodes of the transistor.

A tenth aspect of the invention provides a program for carrying out an optimizing designing method of an integrated circuit which designs a second circuit having the same function as that of a first circuit when producing process, physical specification of a semiconductor or the like is changed, comprising; LOCAL optimizing means for carrying out the optimization of each transistor of the second circuit corresponding to a transistor constituting the first circuit using a circuit simulator; and GLOBAL optimizing means which designates an arbitrary transistor constituting the second circuit, and which optimizes the second circuit by optimizing the designated transistor using a circuit simulator.

According to an eleventh aspect of the invention, in the program of the tenth aspect, in the LOCAL optimization means, a circuit parameter (gate width W, gate length L) of each transistor of the second circuit is optimized using any of the following four conditions, i.e., 1) w value is variable and L value is fixed, 2) W value is fixed and L value is variable, 3) W/L ratio is fixed and W value is variable, and 4) W/L ratio is fixed and L value is variable.

According to a twelfth aspect of the invention, in the program of the tenth aspect, in the GLOBAL optimaizing means, a circuit parameter (gate width W, gate length L) of an arbitrary transistor of a group of transistors of the second circuit is optimized such that the second circuit comes into optimization target value range using any of the following four conditions, i.e., 1) w value is variable and L value is fixed, 2) W value is fixed and L value is variable, 3) W/L ratio is fixed and W value is variable, and 4) W/L ratio is fixed and L value is variable.

According to a thirteenth aspect of the invention, in the program of the tenth aspect, the program further comprises SWEEP sensitivity analysis means for displaying variation in output characteristics of the circuit when the circuit parameter (gate width W, gate length L) of a transistor used in the first circuit and a transistor of the second circuit corresponding to the former transistor of the first circuit is varied by ±α(%).

According to a fourteenth aspect of the invention, in the program of the tenth aspect, the program further comprises operation region analyzing means which carries out DC analysis or TRAN analysis of the circuit for each of a transistor used in the first circuit and a transistor of the second circuit corresponding to the former transistor of the first circuit, which takes out node voltage of the circuit and the transistor current Ids of the circuit obtained as a result of the analysis, which converts the taken out node voltage into the voltages Vds and Vgs between the nodes of the transistor using the circuit topology information, and which displays linear characteristics (Ids-Vgs characteristics) and saturation characteristics (Ids-Vds characteristics) using the transistor current Ids and the voltages Vds and Vgs between the nodes of the transistor.

A fifteenth aspect of the invention provides a storing medium in which an operation region judging program used in an optimizing designing apparatus of an integrated circuit is stored, wherein the program carries out analysis of operation of the circuit, takes out node voltage of the circuit and transistor current Ids of the circuit obtained as a result of the analysis, converts the taken out node voltage into voltages Vds and Vgs between nodes of a transistor using circuit topology information, and judges an operation region (linear region, saturation region) using threshold voltage, the transistor current Ids and the voltages Vds and Vgs between the nodes of the transistor.

A sixteenth aspect of the invention provides a storing medium in which an operation region analysis program used in an optimizing designing apparatus of an integrated circuit is stored, wherein the program carries out DC analysis or TRAN analysis of the circuit, takes out node voltage of the circuit and the transistor current Ids of the circuit obtained as a result of the analysis, converts the taken out node voltage into the voltages Vds and Vgs between the nodes of the transistor using the circuit topology information, and displays linear characteristics (Ids-Vgs characteristics) and saturation characteristics (Ids-Vds characteristics) using the transistor current Ids and the voltages Vds and Vgs between the nodes of the transistor.

A seventeenth aspect of the invention provides a storing medium in which a SWEEP sensitivity analysis program is stored, wherein the program displays variation in output characteristics of the circuit when the circuit parameter (gate width W, gate length L) is varied by ±α(%).

The optimizing designing apparatus of the integrated circuit of the first aspect of the invention comprises the operation region judging means for judging the operation region (linear region, saturation region), the operation region analysis means for displaying the linear characteristics (Ids-Vgs characteristics) and saturation characteristics (Ids-Vds characteristics), and the SWEEP sensitivity analysis means for displaying the variation in output characteristics of the circuit. Since theses circuit analyses can be carried out, it is possible to easily carry out the LOCAL optimization and GLOBAL optimization, and a general circuit can be designed without special know-how.

The optimizing designing apparatus of the integrated circuit of the second aspect of the invention comprises the operation region judging means for judging the operation region (linear region, saturation region), the operation region analysis means for displaying the linear characteristics (Ids-Vgs characteristics) and saturation characteristics (Ids-Vds characteristics), and the LOCAL optimizing means which carries out the optimization of individual transistor. By previously judging and analyzing the operation region, it is possible to easily carry out the LOCAL optimization.

The optimizing designing apparatus of the integrated circuit of the third aspect of the invention comprises the operation region judging means for judging the operation region (linear region, saturation region), the SWEEP sensitivity analysis means for displaying the variation in output characteristics of the circuit, and the GLOBAL optimizing method for optimizing the second circuit. By previously judging the operation region and analyzing the sensitivity, it is possible to easily carry out the GLOBAL optimization.

The optimizing designing apparatus of the integrated circuit of the fourth aspect of the invention comprises the operation region judging means for judging the operation region (linear region, saturation region), the operation region analysis means for displaying the linear characteristics (Ids-Vgs characteristics) and saturation characteristics (Ids-Vds characteristics), the LOCAL optimizing means which carries out the optimization of individual transistor, the SWEEP sensitivity analysis means for displaying the variation in output characteristics of the circuit, and the GLOBAL optimizing method for optimizing the second circuit. By previously judging and analyzing the operation region, it is possible to easily carry out the LOCAL optimization, and by previously analyzing the sensitivity, it is possible to easily carry out the GLOBAL optimization.

The optimizing designing method of the integrated circuit of the fifth aspect of the invention comprises the LOCAL optimization step for carrying out the optimization of each transistor, and the GLOBAL optimization step for carrying out the optimization of the second circuit. By carrying out the LOCAL optimization and then carrying out the GLOBAL optimization, it is possible to easily carry out the optimization in a short time.

According to the sixth aspect of the invention, in the optimizing designing method of the integrated circuit of the fifth aspect, in the LOCAL optimization step, a circuit parameter (gate width W, gate length L) of each transistor of the second circuit is optimized using any of the following four conditions, i.e., 1) w value is variable and L value is fixed, 2) W value is fixed and L value is variable, 3) W/L ratio is fixed and W value is variable, and 4) W/L ratio is fixed and L value is variable. Thus, it is possible to easily carrying out the LOCAL optimization.

According to the seventh aspect of the invention, in the optimizing designing method of the integrated circuit of the fifth aspect, in the GLOBAL optimization step, a circuit parameter (gate width W, gate length L) of an arbitrary transistor of a group of transistors of the second circuit is optimized such that the second circuit comes into optimization target value range using any of the following four conditions, i.e., 1) w value is variable and L value is fixed, 2) W value is fixed and L value is variable, 3) W/L ratio is fixed and W value is variable, and 4) W/L ratio is fixed and L value is variable. Thus, it is possible to easily carrying out the GLOBAL optimization.

According to the eighth aspect, in the optimizing designing method of the integrated circuit of the fifth aspect, the method further comprises the SWEEP sensitivity analysis step for displaying variation in output characteristics of the circuit for a transistor used in the first circuit and a transistor of the second circuit corresponding to the former transistor of the first circuit, and the SWEEP sensitivity analysis step is carried out before the GLOBAL optimization step. Thus, it is possible to easily carry out especially the GLOBAL optimization.

According to the ninth aspect, in the optimizing designing method of the integrated circuit of the fifth aspect, the method further comprises operation region analysis step in which for each of a transistor used in the first circuit and a transistor of the second circuit corresponding to the former transistor of the first circuit, linear characteristics (Ids-Vgs characteristics) and saturation characteristics (Ids-Vds characteristics) are displayed. Thus, it is possible to easily carry out the optimization.

The program of the tenth aspect of the invention for carrying out the optimizing designing method of the integrated circuit comprises the LOCAL optimizing means for carrying out the optimization of each transistor, and the GLOBAL optimizing means for carrying out the optimization of the second circuit. It is possible to carry out the LOCAL optimization and the GLOBAL optimization.

According to the eleventh aspect of the invention, in the program for carrying out the optimizing designing method of the integrated circuit, in the LOCAL optimaizing means, a circuit parameter of each transistor of the second circuit is optimized using any of the following four conditions, i.e., 1) w value is variable and L value is fixed, 2) W value is fixed and L value is variable, 3) W/L ratio is fixed and W value is variable, and 4) W/L ratio is fixed and L value is variable. Thus, it is possible to easily carry out the LOCAL optimization.

According to the twelfth aspect of the invention, in the program for carrying out the optimizing designing method of the integrated circuit, in the GLOBAL optimaizing means, a circuit parameter (gate width W, gate length L) of an arbitrary transistor of a group of transistors of the second circuit is optimized such that the second circuit comes into optimization target value range using any of the following four conditions, i.e., 1) w value is variable and L value is fixed, 2) W value is fixed and L value is variable, 3) W/L ratio is fixed and W value is variable, and 4) W/L ratio is fixed and L value is variable. Thus, it is possible to easily carry out the GLOBAL optimization.

According to the thirteenth aspect of the invention, in the program for carrying out the optimizing designing method of the integrated circuit, the program further comprises SWEEP sensitivity analysis means for displaying variation in output characteristics of the circuit when the circuit parameter (gate width W, gate length L) of a transistor used in the first circuit and a transistor of the second circuit corresponding to the former transistor of the first circuit is varied by $\pm\alpha(\%)$. Thus, it is possible to easily carry out the optimization.

According to the fourteenth aspect of the invention, in the program for carrying out the optimizing designing method of the integrated circuit, the program further comprises means for calculating the linear characteristics (Ids-Vgs characteristics) and the saturation characteristics (Ids-Vds characteristics). Thus, it is possible to easily carry out the optimization.

In the storing medium of the fifteenth aspect of the invention for carrying out the optimizing designing method of the integrated circuit, the operation region judging program used in an optimizing designing apparatus of an integrated circuit is stored, the program carries out analysis of operation of the circuit, takes out node voltage of the circuit and transistor current Ids of the circuit obtained as a result of the analysis, converts the taken out node voltage into voltages Vds and Vgs between nodes of a transistor using circuit topology information, and judges an operation region (linear region, saturation region) using threshold voltage, the transistor current Ids and the voltages Vds and Vgs between the nodes of the transistor. Thus, it is possible to easily carry out the optimization.

In the storing medium of the sixteenth aspect of the invention for carrying out the optimizing designing method of the integrated circuit, the operation region analysis program used in an optimizing designing apparatus of an integrated circuit is stored, the program carries out DC analysis or TRAN analysis of the circuit, takes out node voltage of the circuit and the transistor current Ids of the circuit obtained as a result of the analysis, converts the taken out node voltage into the voltages Vds and Vgs between the nodes of the transistor using the circuit topology information, and displays linear characteristics (Ids-Vgs characteristics) and saturation characteristics (Ids-Vds characteristics) using the transistor current Ids and the voltages Vds and Vgs between the nodes of the transistor. Thus, it is possible to easily carry out the optimization.

The storing medium of the seventeenth aspect of the invention which stores the program for carrying out the optimizing designing method of the integrated circuit, the program displays variation in output characteristics of the circuit when the circuit parameter (gate width W, gate length L) is varied by $\pm\alpha(\%)$. Thus, it is possible to easily carry out the optimization.

BRIEF DESCRIPTION OF THE DRAWINGS

FIG. 11 shows a configuration showing a control setting database of the embodiment.

FIG. 12 shows a configuration showing a spec setting database of the embodiment.

PREFERRED EMBODIMENTS OF THE INVENTION

An optimizing designing apparatus of an integrated circuit according to an embodiment of the present invention will be explained.

Figure 1:
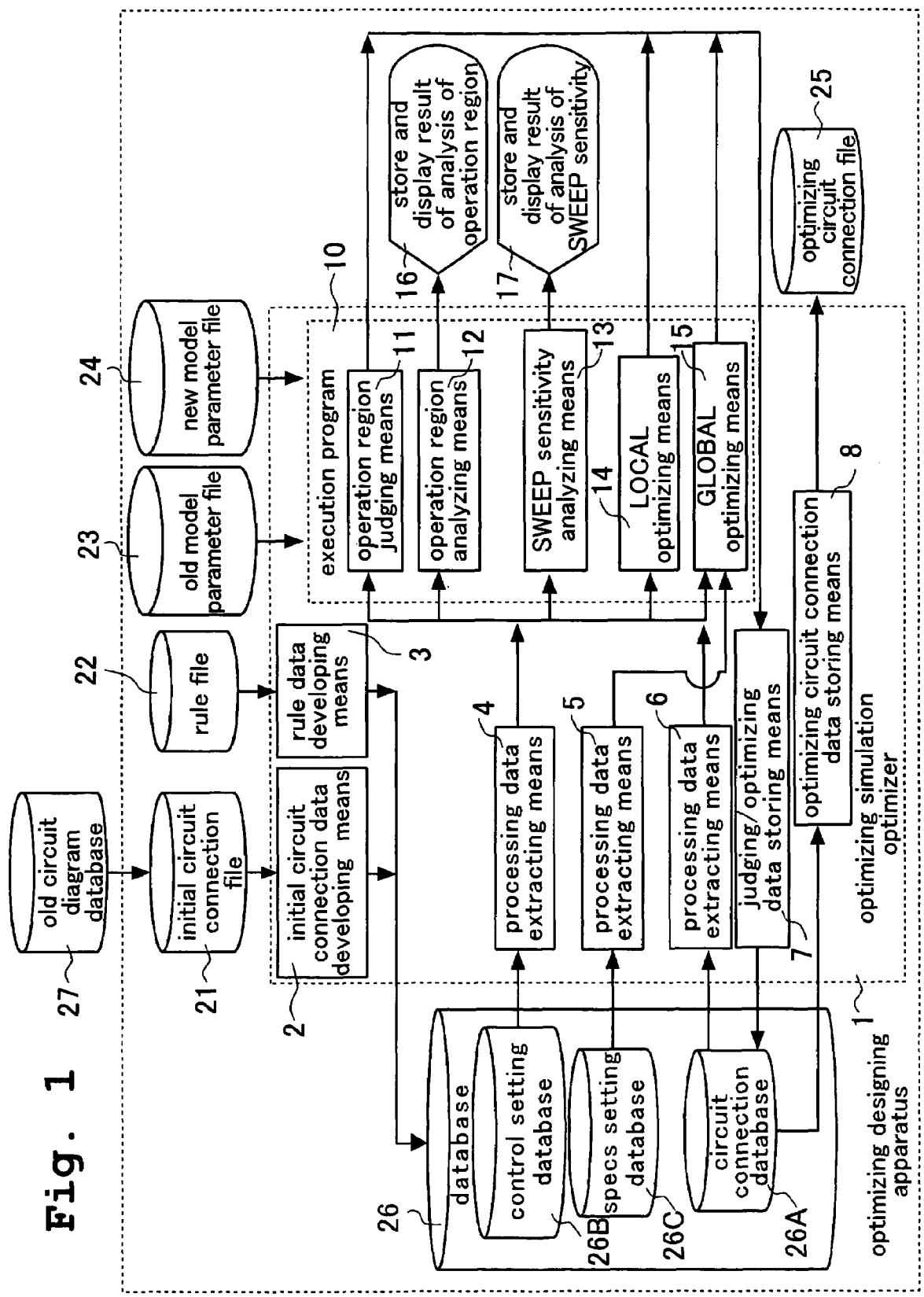
FIG. 1 is a block diagram showing the entire configuration of an optimizing designing apparatus of an integrated circuit according to an embodiment.

FIG. 1 is a block diagram showing the entire configuration of the optimizing designing apparatus of the integrated circuit according to the embodiment.

The optimizing designing apparatus of the integrated circuit according to the embodiment designs an optimizing circuit (second circuit) which is a new circuit having the same function as that of an initial circuit (first circuit) which is an old circuit when producing process or physical specification of a semiconductor is changed. The optimizing designing apparatus includes an optimizing simulation optimizer 1 which is an optimizing designing program and data storing means.

The data storing means comprises an initial circuit connection file 21, a rule file 22, an old model (first circuit) parameter file 23, a new model (second circuit) parameter file 24, an optimizing circuit (second circuit) connection file 25 and a database 26.

Circuit connection data taken out from an old circuit diagram database 27 is stored in the initial circuit connection file 21. Data such as node names of the circuit and using device names of the circuit are stored in the initial circuit connection file 21.

A parameter of a device which depends on the semiconductor process is stored in the rule file 22. For example, in the case of a MOSFET device, "kind of device", "old model name", "new model name", "VTH", "LW adjustment", "difference", "minimum value and maximum value concerning W", "minimum value and maximum value concerning L", "Vbs value", "minimum value and maximum value concerning Vgs", and "minimum value and maximum value concerning Vds" are stored. In the case of a resistance device and capacity device, "kind of device", "minimum value" and "maximum value" are stored.

As the "kind of device", the MOSFET device is described as "M", the resistance device is described as "R", and the capacity device is described as "C". As the "old mode name", model name of the MOSFET used in an initial SPICE net list is described. As the "new model name", model name of the MOS FET which is planed to be used in an optimization SPICE net list is described. As the "VTH", threshold voltage when VBS of MOSTr is equal to 0 is described. In the "LW adjustment", the "VW_FL" means that L value is fixed and optimized with W value. The "VW_FA" means that a ratio W/L is fixed and optimized with W value. The "VL_FW" means that W value is fixed and optimized using L value. The "VL_FA" means that a ratio W/L is fixed and optimized using L value. In the "difference", a difference (%) between old process and new process of each model used in the LOCAL optimization is described. The "W" is W value, and minimum value and maximum value are described. The "L" is L value, and minimum value and maximum value are described. The "Vbs" indicates a keyword of Vbs, and analysis voltage of Vbs to be optimized is described. The "Vgs" indicates a keyword of Vgs, and minimum value of Nch Tr, maximum value of Pch Tr, maximum value of Nch Tr, and minimum value of Pch Tr of Vgs applied voltage are described. The "Vds" indicates a keyword of Vds, and minimum value of Nch Tr, maximum value of Pch Tr, maximum value of Nch Tr, and minimum value of Pch Tr of Vds applied voltage are described.

The old model parameter file 23 stores a parameter group in which coefficients of functions expressing current/voltage (I–V) characteristics used in the circuit simulator are listed under a certain rule concerning device used in the old model which is an already completed integrated circuit. The new model parameter file 24 stores a parameter group in which coefficients of functions expressing current-voltage (I–V) characteristics used in a circuit simulator concerning device which is planed to be used in a new model which is an integrated circuit to be designed. The optimizing circuit connection file 25 stores circuit connection data which was optimized as a result of optimizing processing.

The database 26 comprises a circuit connection database 26A, a control setting database 26B and a spec setting database 26C.

The circuit connection database 26A stores "definition node name", "device name", "old model name", "new model name", "VTH", "equivalence", "optimization region", "difference", "WL adjustment", "DC sensitivity", "TRAN sensitivity", "AC sensitivity", "GLOBAL optimization", "W", "L", "Vbs", "Vgs", "Vds" and "node name". Here, "definition node name" is a node name of a sub-circuit taken out from an old circuit connection file name, "device name" is a name of transistor, resistance, capacity or the like taken out from the old circuit connection file name, the "old model name" is a name of model of transistor used in the old circuit connection file name, the "new model name" is a name of transistor taken out from the new circuit connection file name, the "VTH" is threshold voltage (used for judging saturation region and linear region) used for judging automatic region, "equivalence" is a name of equivalence showing equivalence of transistor, "optimization region" is an optimization region (saturation region and linear region) which is optimized by LOCAL optimization, and "difference" is a difference value which is set at the time of LOCAL optimization. The "WL adjustment" is selection content of L value (fixed) or W/L ration (fixed) with W value (variable), or W value (fixed) or W/L ration (fixed) with L value (variable), "DC sensitivity", "TRAN sensitivity" and "AC sensitivity" are designation content of sensitivity output and sensitivity value (%). In the "GLOBAL optimization", names of specs to be GLOBAL optimized are listed using commas, together with columns of designation (columns to be designated which are to be optimized), the "W" and "L" are transistor parameters which are optimized and minimum value, maximum value, notch, initial value, LOCAL and GLOBAL can be input. The "Vbs", "Vgs" and "Vds" are common values used for LOCAL optimization, they can be varied independently and can designate minimum value and maximum value. The "node name" is used when a result of the operation region analysis is taken out and displayed, and circuit topology information is stored in the circuit connection database 26A.

The control setting database 26B stores therein control data required for executing the circuit simulator. For example, as shown in FIG. 11, the control setting database 26B stores DC power supply voltage, DC analysis condition, DC output variable, TRAN power supply voltage, TRAN analysis condition, TRAN output variable, AC power supply voltage, AC analysis condition, AC output variable and temperature analysis condition.

The spec setting database 26C stores specs data required for executing the circuit simulator. For example, as shown in FIG. 12, the spec setting database 26C stores names of specs, the execution order, analysis condition, difference (%), output variable (characteristics of specs) and temperature condition are stored as specs of the circuit, and output, target value, minimum value, weight, result and comment corresponding to respective inputs are stored.

The optimizing simulation optimizer 1 includes the execution program 10 and other processing means.

The execution program 10 includes operation region judging means 11, operation region analysis means 12, SWEEP sensitivity analysis means 13, the LOCAL optimizing means 14, and GLOBAL optimizing means 15.

As the other processing means, the optimizing simulation optimizer 1 includes initial circuit connection data developing means 2 for extracting circuit connection data from the initial circuit connection file 21, rule data developing means 3 for extracting rule data from the rule file 22, processing data extracting means 4 for extracting control data required for the execution program 10 from the control setting database 26B, processing data extracting means 5 for extracting specs data required for the execution program 10 from the spec setting database 26C, processing data extracting means 6 for extracting circuit connection data required for the execution program 10 from the circuit connection database 26A, judging/optimizing data storing means 7 for storing judging/optimizing data from the operation region judging means 11, the LOCAL optimizing means 14 and the GLOBAL optimizing means 15 in the circuit connection database 26A, and optimizing circuit connection data storing means 8 for storing optimizing data concerning new model circuit extracted from the circuit connection database 26A in the optimizing circuit connection file 25. The optimizing simulation optimizer 1 further includes means 16 for storing and displaying a result of analysis of operation region analyzed by the operation region analysis means 12, and means 17 for storing and displaying a result of sensitivity analysis analyzed by the SWEEP sensitivity analysis means 13.

The optimizing simulation optimizer 1 of the embodiment inputs the initial circuit connection file 21, the rule file 22, the old model parameter file 23 and the new model parameter file 24, repeats data input and output with respect to the database 26 and optimizes the integrated circuit. Data of the operation region judged by the operation region judging means 11 is stored in the circuit connection database 26A and the, is used by the operation region analysis means 12, the SWEEP sensitivity analysis means 13, the LOCAL optimizing means 14 or the GLOBAL optimizing means 15. Data optimized by the LOCAL optimizing means 14 is stored in the circuit connection database 26A and then, is used by the GLOBAL optimizing means 15. A result of optimization which was optimized in this manner is outputted to the optimizing circuit connection file 25.

In FIG. 1, the result of sensitivity analysis by the SWEEP sensitivity analysis means 13 is displayed and outputted, but the data of this sensitivity analysis result can also be stored in the circuit connection database 26A. By storing the sensitivity analysis result by the SWEEP sensitivity analysis means 13 in the circuit connection database 26A in this manner, it is possible to automatically specify a transistor to be optimized when the GLOBAL optimizing means 15 is carried out.

Figure 2:
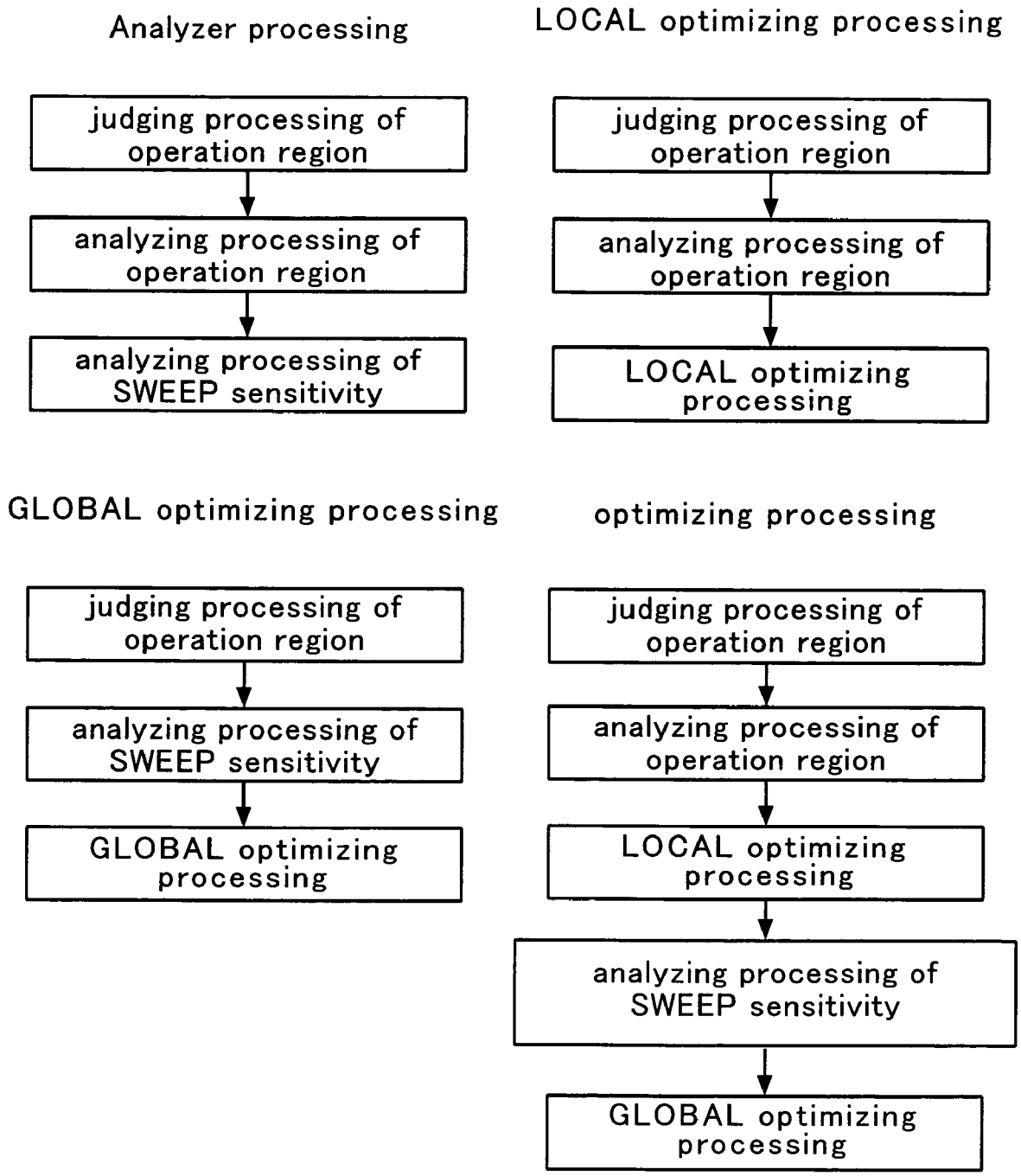
FIG. 2 is a flowchart showing processing procedure of a function of an execution program 10 shown in FIG. 1.

FIG. 2 is a flowchart showing processing procedure of function of the execution program 10. When the optimizing designing apparatus of the embodiment optimizes and designs the integrated circuit, the optimizing designing apparatus can carry out Analyzer processing for analyzing the old model integrated circuit, LOCAL optimizing processing for optimizing such that transistors of the integrated circuit of the old model have the same functions as corresponding transistor which constitute the new model integrated circuit, GLOBAL optimizing processing for optimizing such that the new model integrated circuit has the same function as that of the old model integrated circuit, and optimizing processing in which the LOCAL optimizing processing and the GLOBAL optimizing processing are incorporated.

In the Analyzer processing, analyzing processing of old model circuit are carried out by the operation region judging processing, the operation region analyzing processing and the SWEEP sensitivity analyzing processing. At the time of the analyzing processing, the operation region judging processing and the operation region analyzing processing can selectively be utilized.

In the LOCAL optimizing processing, individual transistors constituting the new model can be optimized by the operation region judging processing, the operation region analyzing processing and the LOCAL optimizing processing. When the optimizing processing is carried out, the operation region judging processing and the operation region analyzing processing can selectively be utilized.

In the GLOBAL optimizing processing, new model integrated circuit can be optimized by the operation region judging processing, the SWEEP sensitivity analyzing processing and the GLOBAL optimizing processing. When the optimizing processing is carried out, the operation region judging processing and the SWEEP sensitivity analyzing processing can selectively be utilized.

In the optimizing processing, the optimization of the circuit can be carried out precisely and at high speed by the operation region judging processing, the operation region analyzing processing, the LOCAL optimizing processing, the SWEEP sensitivity analyzing processing and the GLOBAL optimization.

The above description shows an example of a combination of the operation region judging means 14, the operation region analysis means 15, the SWEEP sensitivity analysis means 16, the LOCAL optimizing means 17 and the GLOBAL optimizing means 18, but other combination is also possible.

Figure 3:
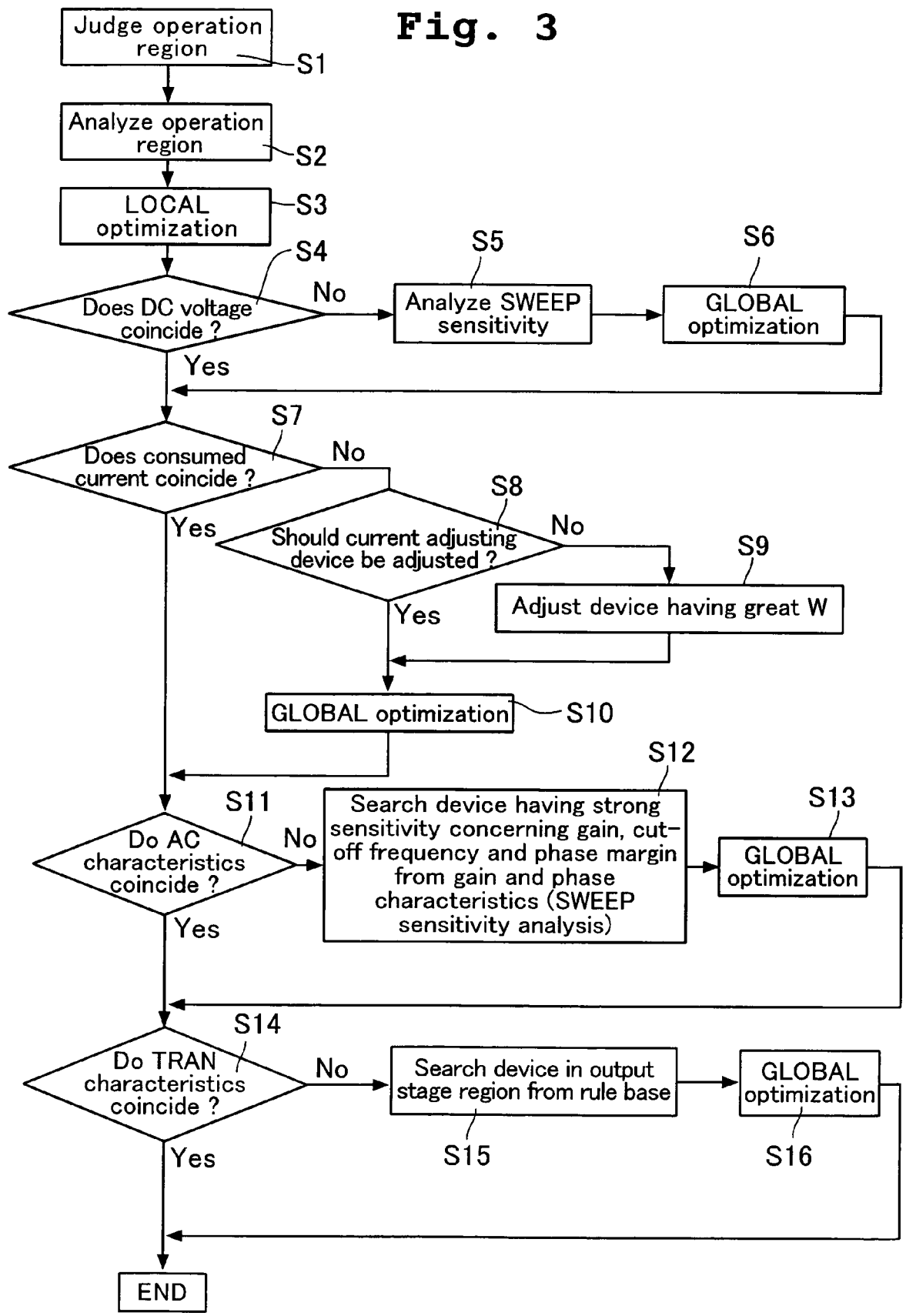
FIG. 3 is a flowchart showing processing procedure of a full automatic optimization of the embodiment.

Next, one embodiment of the full automatic optimizing processing will be explained using FIG. 3.

First, the operation region judging processing (S1), the operation region analyzing processing (S2) and the LOCAL optimizing processing (S3) optimize the individual transistors constituting the new model.

After the individual transistors are optimized in S3, it is judged whether the DC voltage coincides (S4).

If the DC voltage does not coincide in S4, SWEEP sensitivity analysis is carried out (S5), and variation in output characteristics when the circuit parameter is varied is outputted. From the outputted result, the GLOBAL optimization is carried out for a device which shows a difference equal to or greater than a previously stored determined value using a circuit simulator (S6).

When the DC voltage coincides in S4 or after the GLOBAL optimization is carried out in S6, it is judged whether consumed current coincides (S7).

When the consumed current does not coincide in S7, it is judged whether a current-adjusting device is to be adjusted (S8), and when the current-adjusting device is to be adjusted, the GLOBAL optimization is carried out as it is (S10), when the current-adjusting device is not to be adjusted, a device having a large gate width W is adjusted (S9) and then, the GLOBAL optimization is carried out (S10).

When the consumed current coincides in S7 or after the GLOBAL optimization is carried out in S10, it is judged whether AC characteristics coincide (S11).

When the AC characteristics do not coincide in S11, the SWEEP sensitivity analysis is carried out, a device having strong sensitivity concerning gain, cut-off frequency and phase margin is extracted from gain and phase characteristics (S12). The extracted device is optimized using the circuit simulator, thereby carrying out the GLOBAL optimization (S13).

When the AC characteristics coincide in S11 or after the GLOBAL optimization is carried out in S13, it is judged whether TRAN characteristics coincide (S14).

When TRAN characteristics do not coincide in S14, a device in output stage region is searched from the rule base and extracted (S15), and the extracted device is optimized using the circuit simulator, thereby carrying out the GLOBAL optimization (S16).

When TRAN coincides in S14 or GLOBAL optimization is carried out in S16, thereby completing the full automatic optimizing processing.

Figure 4:
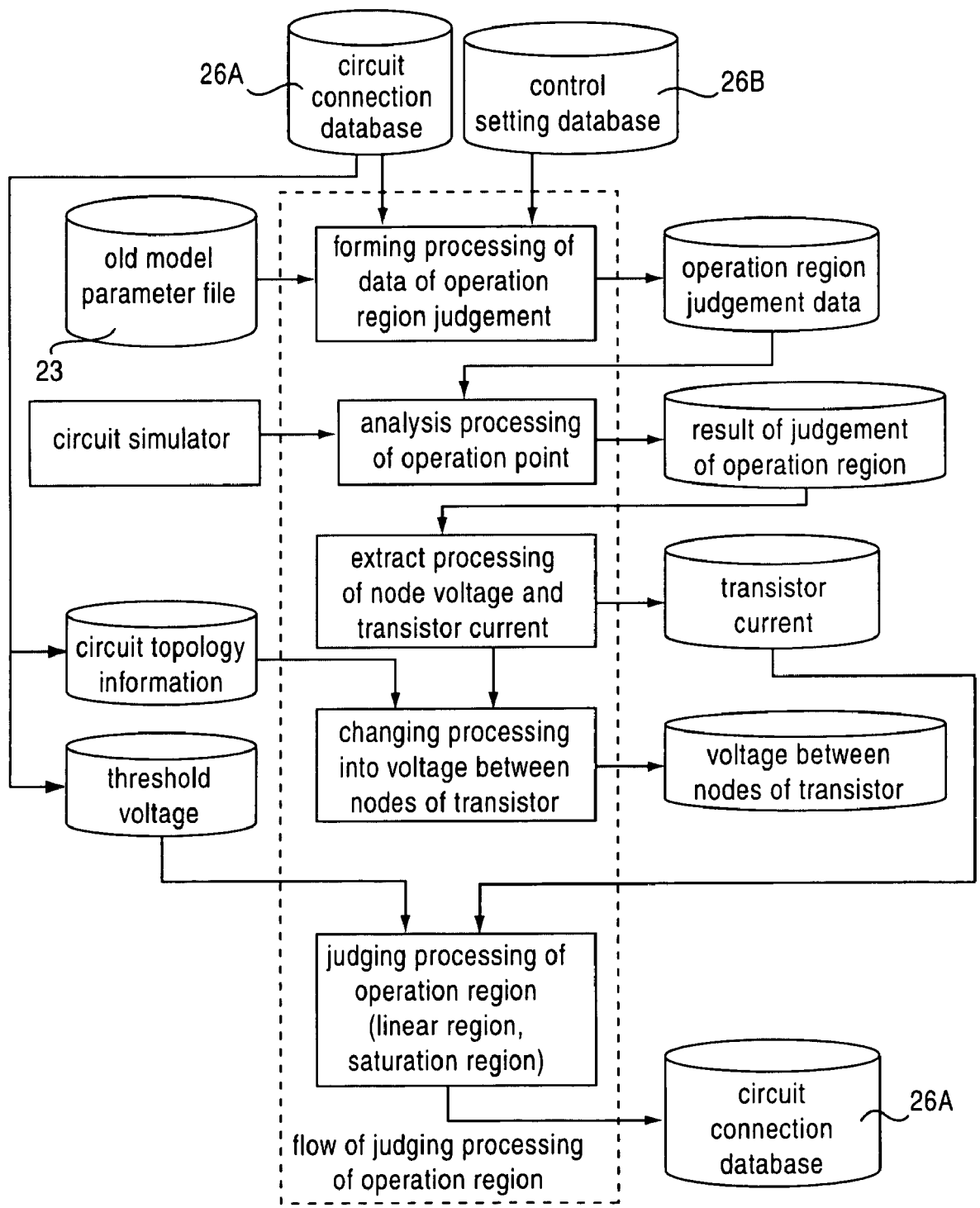
FIG. 4 is a flowchart showing processing procedure of the function of the execution program 10 shown in FIG. 1.

FIG. 4 is a flowchart showing processing procedure of the function of the execution program 10 shown in FIG. 1.

In the operation region judging means 11, data required for judging the operation region is extracted from the circuit connection database 26A, the control setting database 26B and the old model parameter file 23, and operation region judging data is formed. The formed operation region judging data is once stored, the operation of the old model integrated circuit is analyzed using the circuit simulator based on the operation region judging data. A result of the operation region judgment obtained by this operation analysis is once stored. The node voltage of the old model integrated circuit and the transistor current Ids are taken out from data of operation region judgment result. The transistor current Ids taken out in this processing is once stored. The taken out node voltage is converted into voltages Vds and Vgs between nodes of the transistor using the circuit topology, and the voltages Vds and Vgs between nodes of the transistor are once stored. It is automatically judged whether the operation region is in linear region or saturation region using the voltages Vds and Vgs between nodes of the transistor, the transistor current Ids and the threshold voltage. Data concerning the judged operation region is stored in the circuit connection database 26A.

Figure 5:
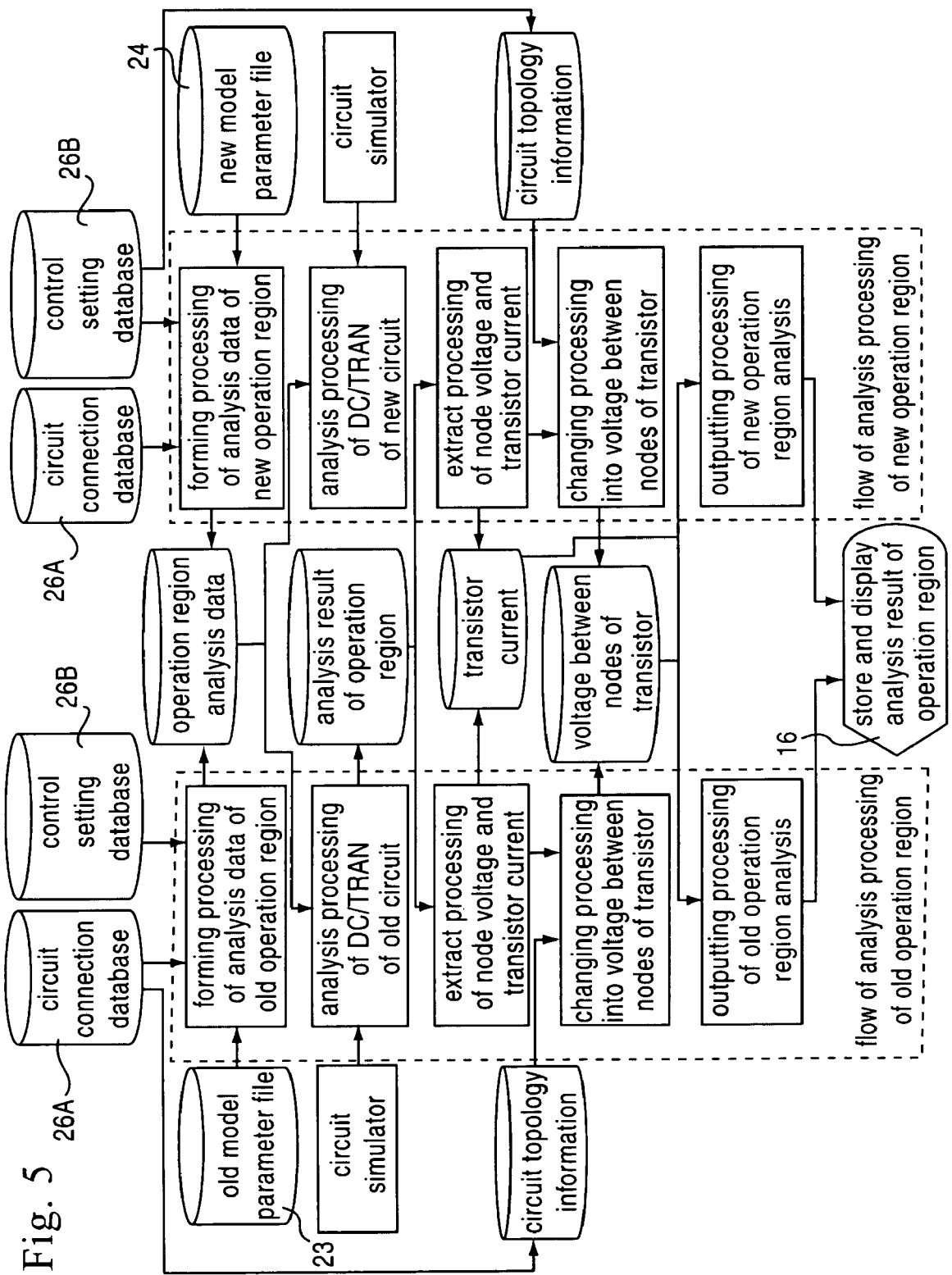
FIG. 5 is a flowchart showing processing procedure of operation region analysis means 12 of the execution program 10 shown in FIG. 1.

FIG. 5 is a flowchart showing processing procedure of the operation region analysis means 12 of the execution program 10 shown in FIG. 1.

First, the operation region analyzing processing of the old model integrated circuit will be explained.

In the operation region analysis means 12, data required for analysis of the operation region is extracted from the circuit connection database 26A, the control setting database 26B and the old model parameter file 23, and old operation region analysis data is formed. The formed old operation region analysis data is once stored, and DC analysis or TRAN analysis of the circuit is carried out for the old model integrated circuit using the circuit simulator based on this old operation region analysis data. Both the DC analysis and the TRAN analysis of the circuit maybe carried out. The operation region analysis result obtained by this old operation region analysis is once stored. The node voltage of the old model integrated circuit and the transistor current Ids are taken out from the data of the stored operation region analysis result. The transistor current Ids taken out by this processing is once stored. The taken out node voltage is converted into the voltages Vds and Vgs between nodes of the transistor using the circuit topology information, and the voltages Vds and Vgs between nodes of the transistor are once stored. Using the voltages Vds and Vgs between nodes of the transistor and the transistor current Ids, the liner characteristics (Ids-Vgs characteristics) and the saturation characteristics (Ids-Vgs characteristics) are analyzed and outputted.

Next, operation region analyzing processing of the new model integrated circuit will be explained. In the case of the Analyzer processing, operation region analyzing processing suffices, but in the case of the LOCAL optimizing processing and the GLOBAL optimizing processing, the operation region analyzing processing of the new model integrated circuit is further carried out.

In the operation region analysis means 12, data required for analysis of the operation region is extracted from the circuit connection database 26A, the control setting database 26B and the new model parameter file 24, and new operation region analysis data is formed. The formed new operation region analysis data is once stored, and the DC analysis or TRAN analysis of the circuit is carried out for the new model integrated circuit using the circuit simulator based on the new operation region analysis data. Both the DC analysis and TRAN analysis of the circuit may be carried out. The operation region analysis result obtained by this new operation region analysis is once stored. The node voltage of the circuit and the transistor current Ids of the new model integrated circuit are taken out from data of the stored operation region analysis result. The transistor current Ids taken out in this processing is once stored. The taken out node voltage is converted into voltages Vds and Vgs between nodes of the transistor using the circuit topology information, and the voltages Vds and Vgs between nodes of the transistor are once stored. Using the voltages Vds and Vgs between nodes of the transistor and the transistor current Ids, the liner characteristics (Ids-Vgs characteristics) and the saturation characteristics (Ids-Vgs characteristics) are analyzed and outputted.

Data concerning the analyzed old model integrated circuit and data concerning the analyzed new model integrated circuit are stored and displayed in overlapped manner in comparison.

The above explained operation region analyzing processing can be carried out before or after the LOCAL optimizing processing and the GLOBAL optimizing processing, but is used for judging the operation region of the transistor mainly in the LOCAL optimizing processing. It is of course possible to use the operation region analyzing processing for the GLOBAL optimizing processing.

Figure 6:
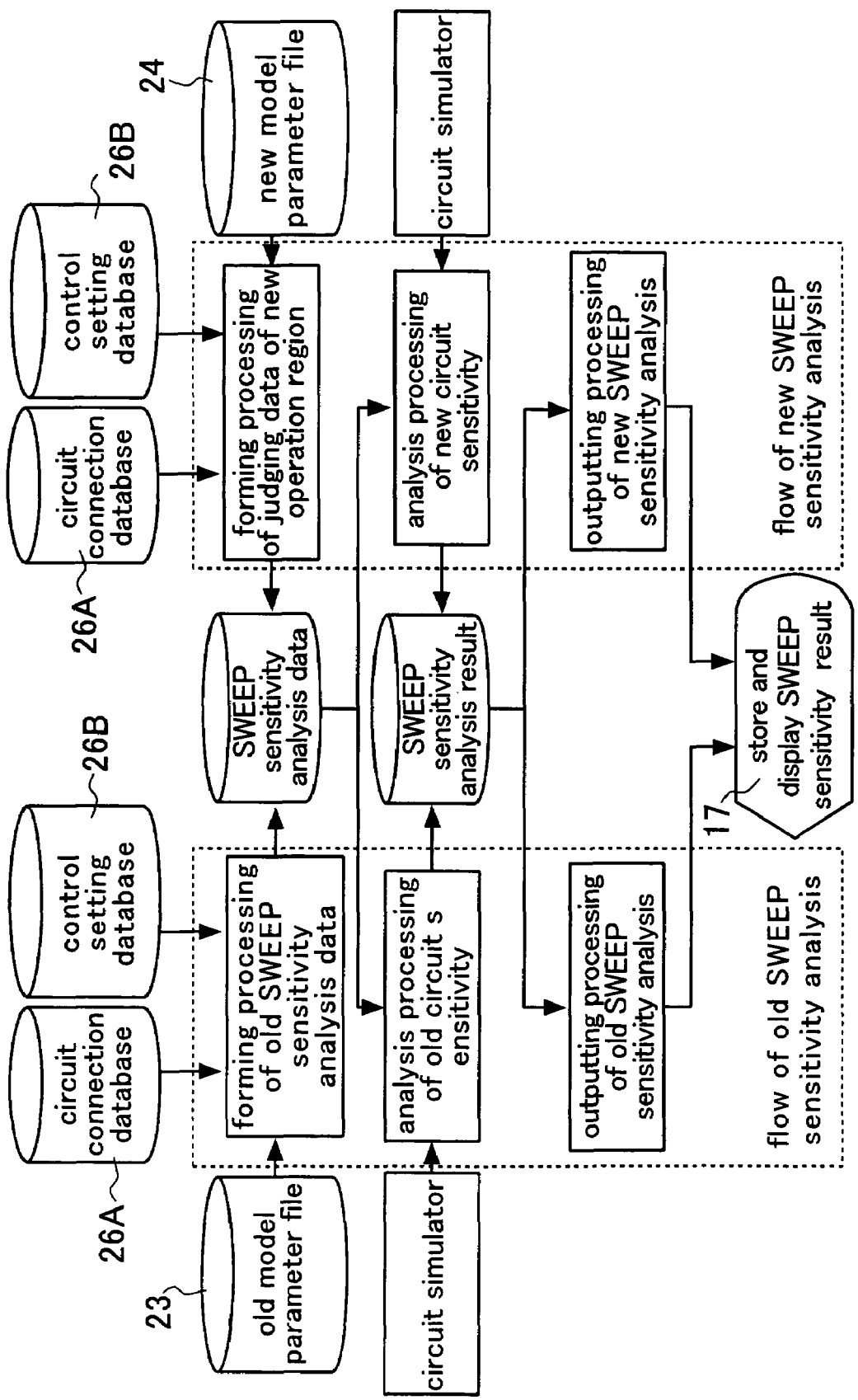
FIG. 6 is a flowchart showing producing process of SWEEP sensitivity analysis means 13 of the execution program 10 shown in FIG. 1.

FIG. 6 is a flowchart showing producing process of the SWEEP sensitivity analysis means 13 of the execution program 10 shown in FIG. 1.

First, the SWEEP sensitivity analyzing processing of the old model integrated circuit will be explained.

In the SWEEP sensitivity analysis means 13, data required for analysis of the old SWEEP sensitivity is extracted from the circuit connection database 26A, the control setting database 26B and the old model parameter file 23, and old SWEEP sensitivity analysis data is formed. The formed old SWEEP sensitivity analysis data is once stored, and the SWEEP sensitivity analysis of the transistor is carried out for the old model integrated circuit using the circuit simulator based on the old SWEEP sensitivity analysis data. In the SWEEP sensitivity analysis, variation in output characteristics when the circuit parameter (gate width, gate length) is varied by ±α(%) is analyzed. The SWEEP sensitivity analysis result obtained by this SWEEP sensitivity analysis is once stored.

Next, the SWEEP sensitivity analyzing processing of the new model integrated circuit will be explained. In the case of the Analyzer processing, the SWEEP sensitivity analysis processing of the old model integrated circuit suffices, but in the case of the LOCAL optimizing processing and the GLOBAL optimizing processing, the SWEEP sensitivity analyzing processing of the new model integrated circuit is further carried out.

In the SWEEP sensitivity analysis means 13, data required for the new SWEEP sensitivity analysis is extracted from the circuit connection database 26A, the control setting database 26B and the new model parameter file 24, and new SWEEP sensitivity analysis data is formed. The formed new SWEEP sensitivity analysis data is once stored, and the SWEEP sensitivity analysis of the transistor is carried out for the new model integrated circuit using the circuit simulator based on the new SWEEP sensitivity analysis data. In the SWEEP sensitivity analysis, variation in output characteristics when the circuit parameter (gate width, gate length) is varied by ±α(%) is analyzed. The SWEEP sensitivity analysis result obtained by this SWEEP sensitivity analysis is once stored.

Data concerning the SWEEP sensitivity analysis of old model integrated circuit and data concerning the SWEEP sensitivity analysis of the new model integrated circuit are stored and displayed in overlapped manner in comparison.

The above explained SWEEP sensitivity analyzing processing can be carried out before or after the LOCAL optimizing processing and the GLOBAL optimizing processing, but is used for analyzing the SWEEP sensitivity of the transistor mainly in the GLOBAL optimizing processing. It is of course possible to use the SWEEP sensitivity analyzing processing for the LOCAL optimizing processing.

Figure 7:
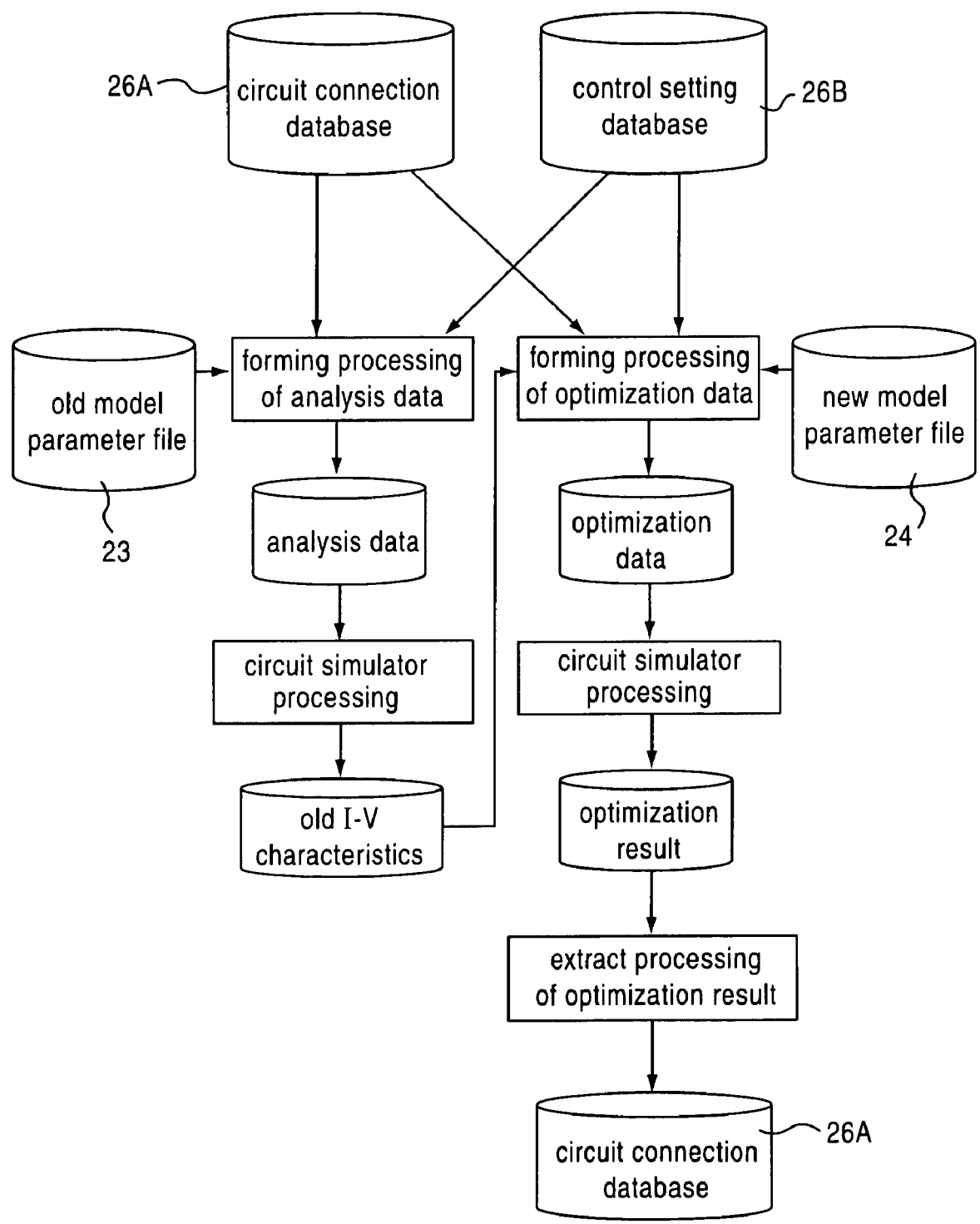
FIG. 7 is a flowchart showing producing process of LOCAL optimizing means 14 of the execution program 10 shown in FIG. 1.

FIG. 7 is a flowchart showing producing process of the LOCAL optimizing means 14 of the execution program 10 shown in FIG. 1.

In the LOCAL optimizing means 14, data required for analysis of the transistor used in the old model integrated circuit is extracted from the circuit connection database 26A, the control setting database 26B and the old model parameter file 23, and analysis data of old model is formed. The formed old analysis data is once stored, and old I-V characteristics of the transistor are allowed to generate for the old model integrated circuit using the circuit simulator based on the old analysis data, and the data is once stored.

In the forming processing of the optimizing data, data required for the analysis of the transistor used in the new model integrated circuit is extracted from the circuit connection database 26A, the control setting database 26B and the new model parameter file 24, and optimizing data for executing the circuit simulator using Levenberg-Marquadt method is formed together with the stored old I-V characteristics. In the circuit simulator, optimization using the Levenberg-Marquadt method is carried out using this optimizing data. More specifically, circuit parameter (gate width W, gate length L) of each transistor of the new model is optimized such that the characteristics thereof becomes equal to those of the corresponding transistor of the old model using any of the following four conditions, i.e., 1) w value is variable and L value is fixed, 2) W value is fixed and L value is variable, 3) W/L ratio is fixed and W value is variable, and 4) W/L ratio is fixed and L value is variable. The optimization result is allowed to generate by this optimizing processing, the optimization result is taken out and is stored in the circuit connection database 26A.

Figure 8:
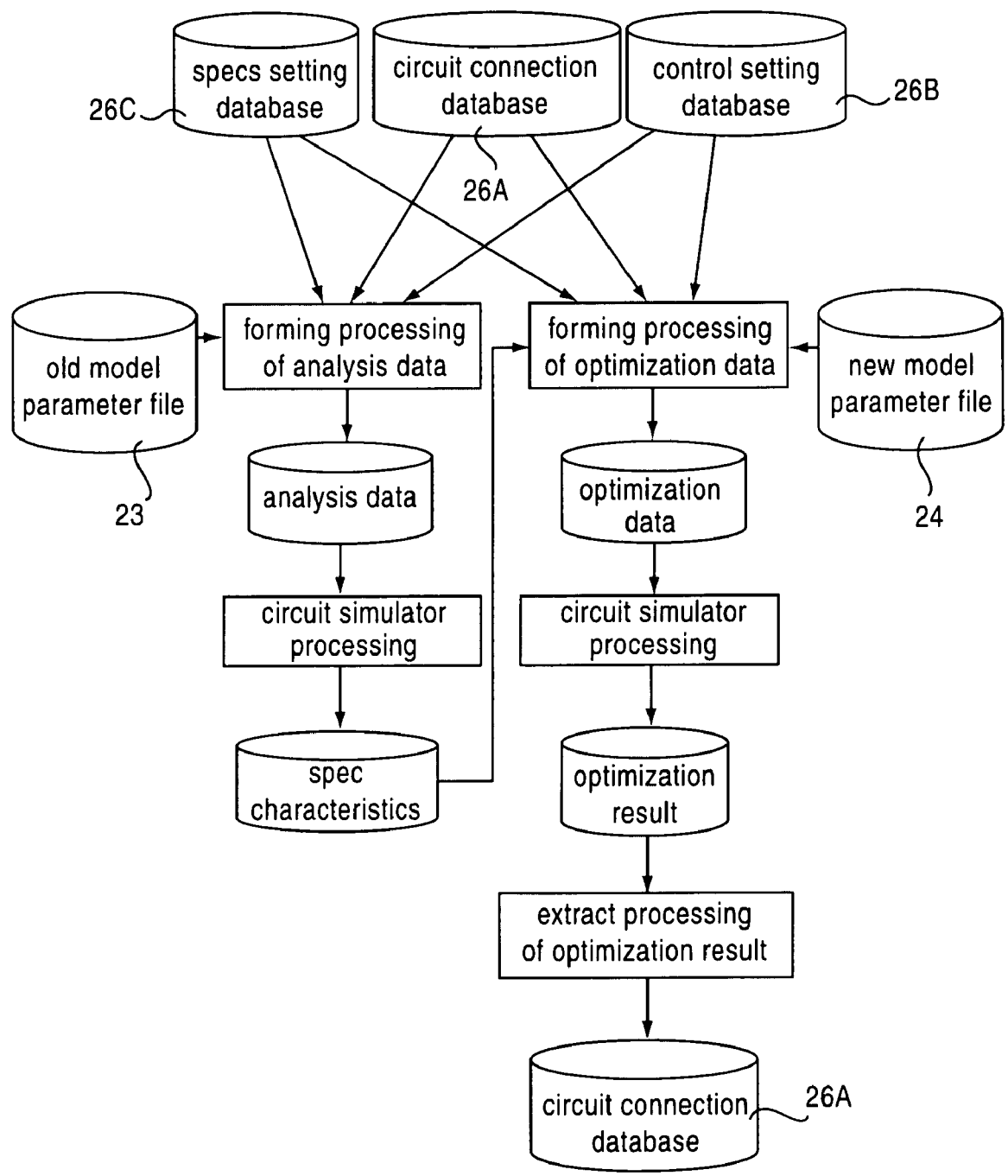
FIG. 8 is a flowchart showing producing process of GLOBAL optimizing means 15 of the execution program 10 shown in FIG. 1.

FIG. 8 is a flowchart showing producing process of the GLOBAL optimizing means 15 of the execution program 10 shown in FIG. 1.

In the GLOBAL optimizing means 15, data required for the analysis of the old model integrated circuit is extracted from the circuit connection database 26A, the control setting database 26B and the spec setting database 26C and the old model parameter file 23, and analysis data of the old model is formed. The formed old analysis data is once stored, and specs characteristics are allowed to generate for the old model integrated circuit using the circuit simulator based on the old analysis data, and the data is once stored.

In the forming processing of the optimizing data, data required for the analysis of the new model integrated circuit is extracted from the circuit connection database 26A, the control setting database 26B, the spec setting database 26C and the new model parameter file 24, and optimizing data for executing the circuit simulator using Levenberg-Marquadt method is formed together with the stored specs characteristics. Information of the transistor to be optimized is taken from the spec setting database 26C. In the circuit simulator, optimization using the Levenberg-Marquadt method is carried out using this optimizing data. More specifically, circuit parameter (gate width W, gate length L) of each transistor of arbitrary new model is optimized such that the specs of the new model become equal to those of the old model using any of the following four conditions, i.e., 1) w value is variable and L value is fixed, 2) W value is fixed and L value is variable, 3) W/L ratio is fixed and W value is variable, and 4) W/L ratio is fixed and L value is variable. The optimization result is allowed to generate by this optimizing processing, the optimization result is taken out and is stored in the circuit connection database 26A.

Figure 9:
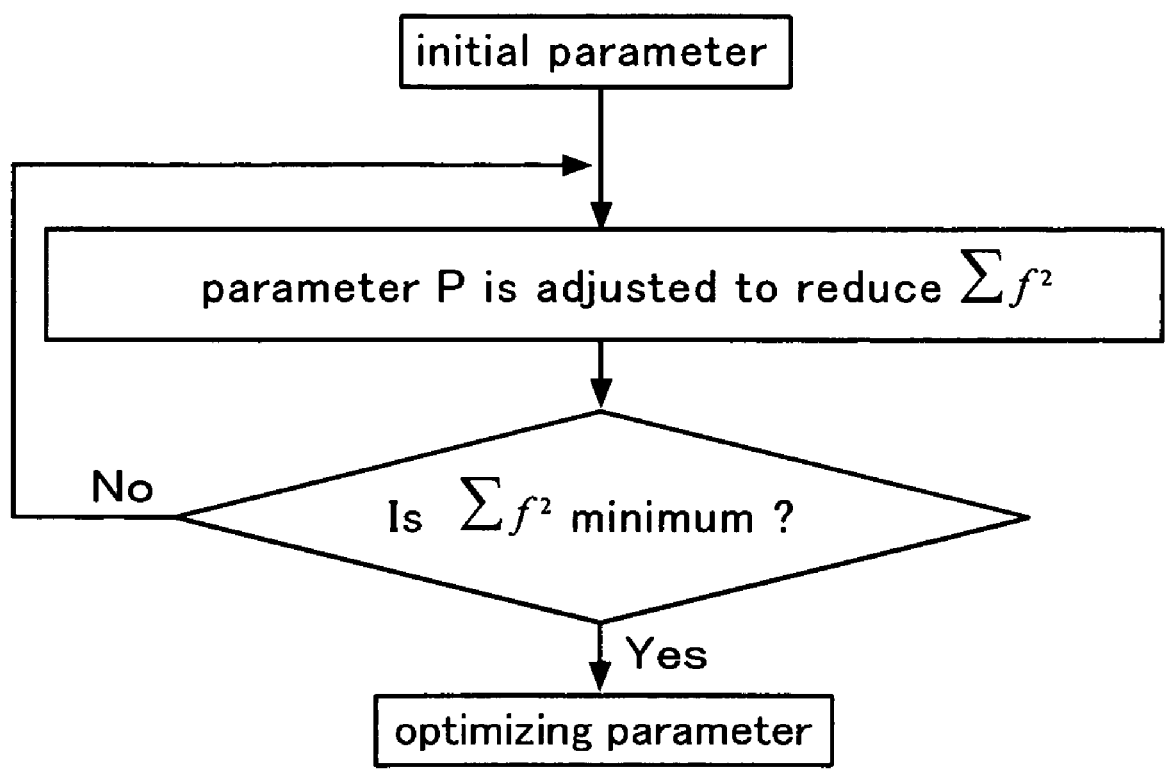
FIG. 9 is a flowchart of a nonlinear optimizing method in a circuit simulation used in this embodiment.

FIG. 9 is a flowchart of a nonlinear optimizing method in the circuit simulation used in this embodiment, and shows the Levenberg-Marquadt method. This method is excellent in the nonlinear optimizing method, but this embodiment is not limited to the Levenberg-Marquadt method.

A relation equation by the Levenberg-Marquadt method is shown in the equation 1, and one example of optimization objective function used in the Levenberg-Marquadt method is shown in the equation 2.

Levenberg-Marquadt method [Equation 1]

$$P_{k+1} = P_k - (J^T J + \lambda_k (J^T J)_{ii})^{-1} J^T \cdot f(P_k)$$

$$J_{ij} = \frac{\partial f_i(P_k)}{\partial x_j}$$

-continued

Optimization objective function [Equation 2]

$$\|f(P)\|^2 = \sum_{k=1}^{n} f_k(P) = \sum_{k=1}^{n} \left( \frac{I_k(P) - I_k^*}{\max(I_k^*, I_{min})} \right)^2$$

Figure 10:
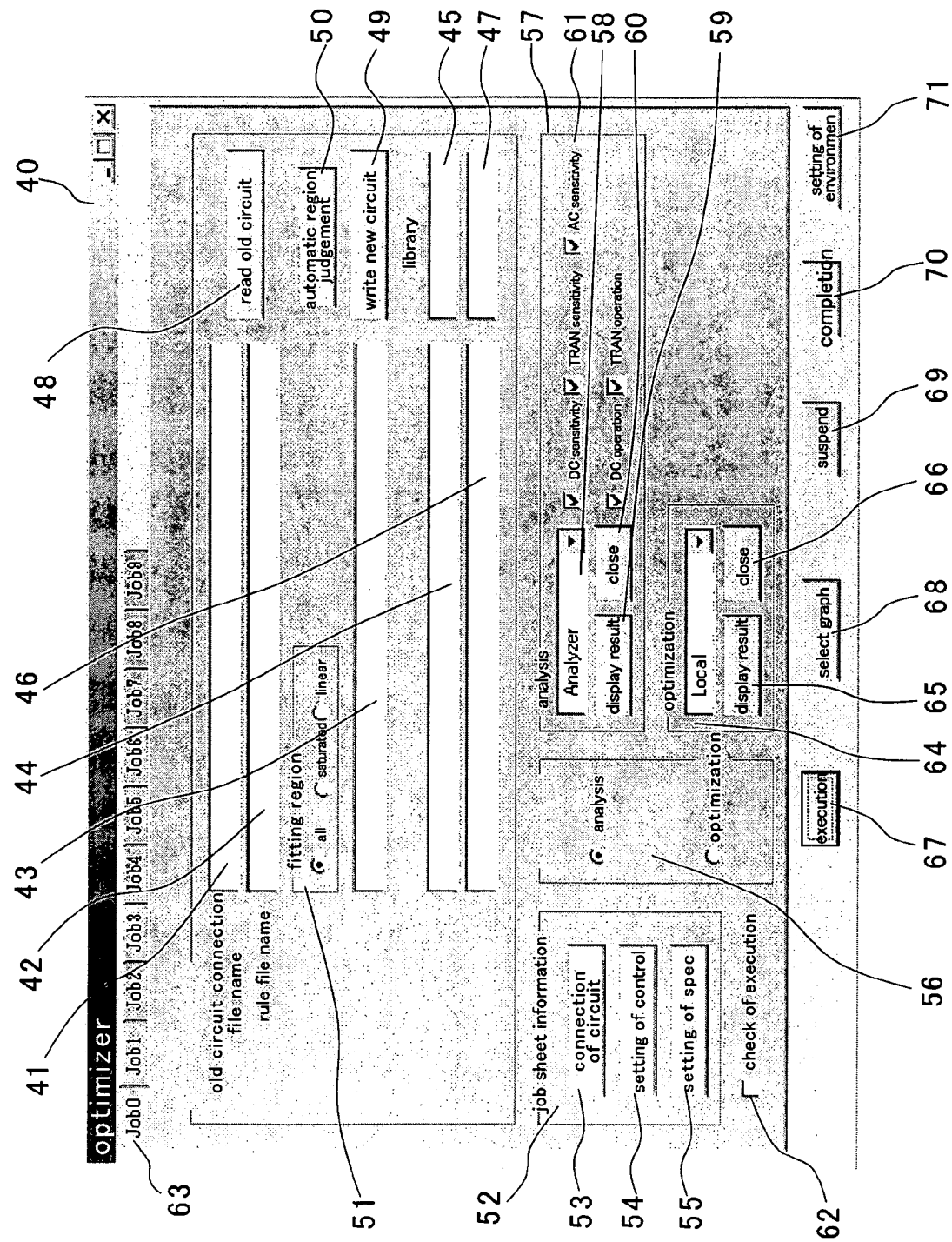
FIG. 10 shows a menu screen which is one example of an apparatus using the optimizing method of the embodiment.

$I_k(P)$: calculated drain current
$I^*_k$: actually measured value at k-th data point
$I_{min}$: aroung prepared by user FIG. 10 shows a menu screen which is one example of an apparatus using the optimizing method of the embodiment.

A menu screen 40 includes a plurality of input columns. An initial circuit connection file name is inputted in an input column 41, a rule file name is inputted in an input column 42, a new circuit connection file name is inputted in an input column 43, an old model parameter file name is inputted in an input column 44, a library name of the old model parameter file is inputted in an input column 45, a new model parameter file name is inputted in an input column 46, and a library name of the new model parameter file is inputted in an input column 47.

The menu screen 40 includes a check button for reading a predetermined file which was inputted to the input column. An old circuit reading button 48 corresponds to the input columns 41 and 42 and is a check button for reading an initial circuit connection file and a rule file. A new circuit reading button 49 corresponds to the input column 43 and is a check button for reading the new circuit connection file.

An automatic region judging button 50 instructs to judge the operation region of a transistor used in the initial circuit. The automatic region judging button 50 includes a fitting region selecting column 51 capable of previously instructing whether the operation region of the transistor is the entire region, a saturation region or a fan region when judging the operation region.

A job sheet information display column 52 includes a circuit connection button 53, a control setting button 54 and a spec setting button 55. Here, the circuit connection button 53 instructs to display a circuit connection database and can display a region where data read from the initial circuit connection file and the rule file is stored. The control setting button 54 instructs to display the control setting database, and can display a region where a circuit simulation analysis condition is stored. The spec setting button 55 instructs to display a spec setting database, and can display a region where specs used for the GLOBAL optimizing processing is stored. If any of data contents displayed by the instructions from these buttons should be changed, such contents can be changed.

An execution selecting column 56 selects which one of the analyzing processing and the optimizing processing should be executed. An analysis column 57 includes a selecting column 58 of an analyzing processing mode (Analyzer, LOCAL, GLOBAL), a display button 59 of a result of the analysis, a button 60 for closing the analysis result, and a selection check column 61 of DC sensitivity, TRAN sensitivity, AC sensitivity, DC operation and TRAN operation. An execution check column 62 has a check box of optimizing processing. If this check box is checked, contents of a checked tag 63 are executed, and a plurality of jobs can be processed continuously. In an optimization column 64, optimizing processing modes (LOCAL, GLOBAL) can be selected from a pull-down input column, a result of optimization is displayed by pushing a result display button 65, and if a closing button 66 is pushed, the result of optimization is closed. It is possible to execute one of the analyzing processing and the optimizing processing using an execution button 67. Through a graph selecting button 68, a predetermined graph can be selected from a group of graphs formed in the analyzing processing or the optimizing processing. Using a suspending button 69, it is possible to suspend the analyzing processing or the optimizing processing. A program is completed using a completing button 70. Using an environment setting button 71, it is possible to set an environment for allowing a program in a plurality of machine environments.

Especially the present invention is different from the conventional technique in that since parameters of a device on a circuit are automatically converted into variables in a program, an operation in the conventional technique for converting all parameters into the variable for full automatization is unnecessary, in that since circuit change and a device value change are separated from the circuit diagram database by inputting a net list of the SPICE format, it is easy to change, in that when the process is changed, the characteristics of each transistor device is LOCAL optimized and then, portions to be corrected are narrowed by the SWEEP sensitivity analysis and the integrated circuit is GLOBAL optimized and thus, the number of portions of the spec adjustment to be corrected is small and the execution time is short, in that since a designer can designate a point to be spec adjusted each time by the operation region analysis and the SWEEP sensitivity analysis, optimization can be carried out precisely, and appropriate answer can be achieved, and since there is no useless simulation, the execution time is short, in that since the optimization simulator using the Levenberg-Marquadt method is used, the execution time is short and the precision is high, in that procedure and steps for optimization can be defined for each circuit model, and the procedure and steps can be changed and thus, an intention of the designer can be realized, in that the execution process of the optimization can be saved as grid data, in that all measuring functions can be used for the optimization and sensitivity analysis with respect to a target specification, kinds of target performance in the optimization are not limited, in that since an initial value, an omitted value and operation region to be optimized are automatically set, the number of parameters which should be inputted by the designer is small, and the operability is excellent, and in that since the adjustment can be carried out while taking equivalence into consideration, the operation of a current mirror circuit is secured.

The present invention provides means for carrying out operation region analysis for every device, means for carrying out LOCAL optimization for each device, means for carrying out SWEEP sensitivity analysis for checking a parameter having high device sensitivity using a result of the LOCAL optimization as an initial value, and means for designating the parameter checked by the SWEEP sensitivity analysis using a result of the LOCAL optimization as an initial value. Therefore, there is effect that the optimization precision is high, appropriate answer intended by a designer is achieved, and optimizing processing time is short.

What is claimed is:

1. An optimizing designing apparatus of an integrated circuit for designing a circuit, comprising:
  operation region judging means which carries out analysis of operation of said circuit, which extracts node voltage of the circuit and transistor current Ids of the circuit obtained as a result of the analysis, which converts the extracted node voltage into voltages Vds and Vgs between nodes of a transistor using a circuit topology information, and which judges an operation region including a linear region and a saturation region using threshold voltage, the transistor current Ids and the voltages Vds and Vgs between the nodes of the transistor;

operation region analysis means which carries out DC analysis or TRAN analysis of the circuit, which extracts node voltage of the circuit and the transistor current Ids of the circuit obtained as a result of the analysis by the operation region analysis means, which converts the extracted node voltage into the voltages Vds and Vgs between the nodes of the transistor using the circuit topology information, and which displays linear characteristics including Ids-Vgs characteristics and saturation characteristics including Ids-Vds characteristics using the transistor current Ids and the voltages Vds and Vgs between the nodes of the transistor; and SWEEP sensitivity analysis means which displays variation in output characteristics of said circuit when the circuit parameter including gate width W and gate length L is varied by $\pm\alpha(\%)$.

2. An optimizing designing apparatus of an integrated circuit for designing a second circuit having the same function as that of a first circuit when producing process, physical specification of a semiconductor is changed, comprising:

operation region judging means which carries out analysis of operation of said circuit, which extracts node voltage of the circuit and transistor current Ids of the circuit obtained as a result of the analysis by the operation region judging means, which converts the extracted node voltage into voltages Vds and Vgs between nodes of a transistor using a circuit topology information, and which judges an operation region including linear region and saturation region using threshold voltage, the transistor current Ids and the voltages Vds and Vgs between the nodes of the transistor;

operation region analysis means which carries out DC analysis or TRAN analysis of the circuit, which extracts node voltage of the circuit and the transistor current Ids of the circuit obtained as a result of the analysis by the operation region analysis means, which converts the extracted node voltage into the voltages Vds and Vgs between the nodes of the transistor using the circuit topology information, and which displays linear characteristics including Ids-Vgs characteristics and saturation characteristics including Ids-Vds characteristics using the transistor current Ids and the voltages Vds and Vgs between the nodes of the transistor; and LOCAL optimizing means for carrying out the optimization of each transistor of said second circuit corresponding to a transistor constituting said first circuit using a circuit simulator.

3. An optimizing designing apparatus of an integrated circuit for designing a second circuit having the same function as that of a first circuit when producing process, physical specification of a semiconductor is changed, comprising:

operation region judging means which carries out analysis of operation of said circuit, which extracts node voltage of the circuit and transistor current Ids of the circuit obtained as a result of the analysis by the operation region judging means, which converts the extracted node voltage into voltages Vds and Vgs between nodes of a transistor using circuit topology information, and which judges an operation region including linear region and saturation region using threshold voltage, the transistor current Ids and the voltages Vds and Vgs between the nodes of the transistor;

SWEEP sensitivity analysis means which displays variation in output characteristics of said circuit when the circuit parameter including gate width W and gate length L is varied by $\pm\alpha(\%)$; and GLOBAL optimizing means which designates an arbitrary transistor constituting said second circuit, and which optimizes said second circuit by optimizing the designated transistor using a circuit simulator.

4. An optimizing designing apparatus of an integrated circuit for designing a second circuit having the same function as that of a first circuit when producing process, physical specification of a semiconductor is changed, comprising:

operation region judging means which carries out analysis of operation of said circuit, which extracts node voltage of the circuit and transistor current Ids of the circuit obtained as a result of the analysis by the operation region judging means, which converts the extracted node voltage into voltages Vds and Vgs between nodes of a transistor using circuit topology information, and which judges an operation region including linear region and saturation region using threshold voltage, the transistor current Ids and the voltages Vds and Vgs between the nodes of the transistor;

operation region analysis means which carries out DC analysis or TRAN analysis of the circuit, which extracts node voltage of the circuit and the transistor current Ids of the circuit obtained as a result of the analysis by the operation region analysis means, which converts the extracted node voltage into the voltages Vds and Vgs between the nodes of the transistor using the circuit topology information, and which displays linear characteristics including Ids-Vgs characteristics and saturation characteristics including Ids-Vgs characteristics using the transistor current Ids and the voltages Vds and Vgs between the nodes of the transistor;

LOCAL optimizing means for carrying out the optimization of each transistor of said second circuit corresponding to a transistor constituting said first circuit using a circuit simulator; SWEEP sensitivity analysis means which displays variation in output characteristics of said circuit when the circuit parameter including gate width W and gate length L is varied by $\pm\alpha(\%)$; and GLOBAL optimizing means which designates an arbitrary transistor constituting said second circuit, and which optimizes said second circuit by optimizing the designated transistor using a circuit simulator.

* * * * *